(12) United States Patent
Yamauchi et al.

(10) Patent No.: US 11,860,542 B2
(45) Date of Patent: Jan. 2, 2024

(54) LIQUID TREATMENT APPARATUS AND METHOD OF ADJUSTING TEMPERATURE OF TREATMENT LIQUID

(71) Applicant: TOKYO ELECTRON LIMITED, Tokyo (JP)

(72) Inventors: Takashi Yamauchi, Koshi (JP); Daiki Shibata, Koshi (JP); Kohei Kawakami, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 18/098,572

(22) Filed: Jan. 18, 2023

(65) Prior Publication Data

US 2023/0152703 A1 May 18, 2023

Related U.S. Application Data

(63) Continuation of application No. 17/113,591, filed on Dec. 7, 2020, now Pat. No. 11,561,473.

(30) Foreign Application Priority Data

Dec. 12, 2019 (JP) ................................. 2019-224551

(51) Int. Cl.
*G03F 7/16* (2006.01)
*H01L 21/67* (2006.01)
(Continued)

(52) U.S. Cl.
CPC .............. *G03F 7/162* (2013.01); *B05B 9/002* (2013.01); *B05C 11/1042* (2013.01);
(Continued)

(58) Field of Classification Search
None
See application file for complete search history.

(56) References Cited

U.S. PATENT DOCUMENTS

2002/0179283 A1 12/2002 Suenaga
2008/0289715 A1 11/2008 Nakashima
(Continued)

FOREIGN PATENT DOCUMENTS

JP 2008-085263 A 4/2008
JP 2011-014849 A 1/2011
(Continued)

*Primary Examiner* — Binu Thomas
(74) *Attorney, Agent, or Firm* — Nath, Goldberg & Meyer; Jerald L. Meyer; Tanya E. Harkins

(57) ABSTRACT

A liquid treatment apparatus includes: a substrate holder for holding a substrate; a discharge nozzle for discharging a treatment liquid onto the substrate; a liquid supply pipe for supplying the treatment liquid from a treatment liquid storage source to the discharge nozzle; a gas pipe that encompasses the liquid supply pipe and through which an inert gas for adjusting the temperature of the treatment liquid flows in a space between the gas pipe and the liquid supply pipe; a processing container in which the substrate holder, the discharge nozzle, the liquid supply pipe, and the gas pipe are provided; and an atmosphere gas supply part for supplying an atmosphere gas into the processing container. The gas pipe is provided so that an extension portion between an upstream end inside the processing container and an encompassing portion is folded back inside the processing container in a plan view.

14 Claims, 3 Drawing Sheets

(51) Int. Cl.
  *B05C 11/10*  (2006.01)
  *B05B 9/00*  (2006.01)
  *H01L 21/687*  (2006.01)
  *H01L 21/027*  (2006.01)

(52) U.S. Cl.
  CPC .... *H01L 21/6715* (2013.01); *H01L 21/67017* (2013.01); *H01L 21/67248* (2013.01); *H01L 21/68764* (2013.01); *H01L 21/0273* (2013.01)

(56) References Cited

U.S. PATENT DOCUMENTS

| | | |
|---|---|---|
| 2011/0240601 A1 | 10/2011 | Hashizume |
| 2012/0052190 A1 | 3/2012 | Sasagawa |
| 2014/0148006 A1 | 5/2014 | Tanaka |
| 2014/0370199 A1 | 12/2014 | Kishita |

FOREIGN PATENT DOCUMENTS

| | | |
|---|---|---|
| JP | 2017-027966 A | 2/2017 |
| JP | 2019-195017 A | 11/2019 |
| KR | 20110004278 A | 1/2011 |

LIQUID TREATMENT APPARATUS AND METHOD OF ADJUSTING TEMPERATURE OF TREATMENT LIQUID

CROSS-REFERENCE TO RELATED APPLICATION

This is a Continuation Application of U.S. patent application Ser. No. 17/113,591, filed Dec. 7, 2020, an application claiming the benefit from Japanese Application No. 22019-224551, filed Dec. 12, 2019, the contents of each of which are hereby incorporated by reference in their entirety.

TECHNICAL FIELD

The present disclosure relates to a liquid treatment apparatus and a method of adjusting a temperature of a treatment liquid.

BACKGROUND

Patent Document 1 discloses a film coating apparatus which includes a coating container into which a substrate is loaded and a film coating is performed on the substrate, a coating liquid container for holding a coating liquid, and a liquid transport system for transporting the coating liquid from the coating liquid container to the coating container. The film coating apparatus is provided with a means for suppressing the content of water in the coated film. Further, in Patent Document 1, the suppressing means includes a double resin pipe, and a gas including an inert gas exists in a space between an inner pipe and an outer pipe of the double resin pipe so that the double resin pipe is used in the transport system. Further, a resist coating apparatus used as the film coating apparatus of Patent Document 1 includes a resist discharge device, resist lines as the liquid transport system, a resist supply container as the coating liquid container, and a pipe connecting them. The resist discharging device includes a resist temperature adjusting pipe having a triple structure, and a nozzle. In addition, the triple-structured resist temperature adjusting pipe includes a cooling-water for temperature-adjustment inflow pipe composed of a polyvinyl chloride (PVC)-based tube into which a cooling water for temperature adjustment flows, and a cooling-water for temperature-adjustment outflow pipe composed of a tetrafluoroethylene perfluoroalkylvinylether copolymer (PFA) tube from which the cooling water for temperature adjustment is discharged.

PRIOR ART DOCUMENTS

Patent Document

Japanese laid-open publication No. 2008-085263

SUMMARY

According to one embodiment of the present disclosure, there is provided a liquid treatment apparatus including: a substrate holder configured to hold a substrate; a discharge nozzle configured to discharge a treatment liquid onto the substrate held by the substrate holder; a liquid supply pipe configured to supply the treatment liquid from a treatment liquid storage source to the discharge nozzle; a gas pipe that encompasses the liquid supply pipe and through which an inert gas for adjusting the temperature of the treatment liquid flows in a space between the gas pipe and the liquid supply pipe; a processing container in which the substrate holder, the discharge nozzle, the liquid supply pipe, and the gas pipe are provided; and an atmosphere gas supply part configured to supply an atmosphere gas into the processing container, wherein an extension portion of the gas pipe is folded back inside the processing container in a plan view, the extension portion being a portion between an upstream end inside the processing container and an encompassing portion that encompasses the liquid supply pipe.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
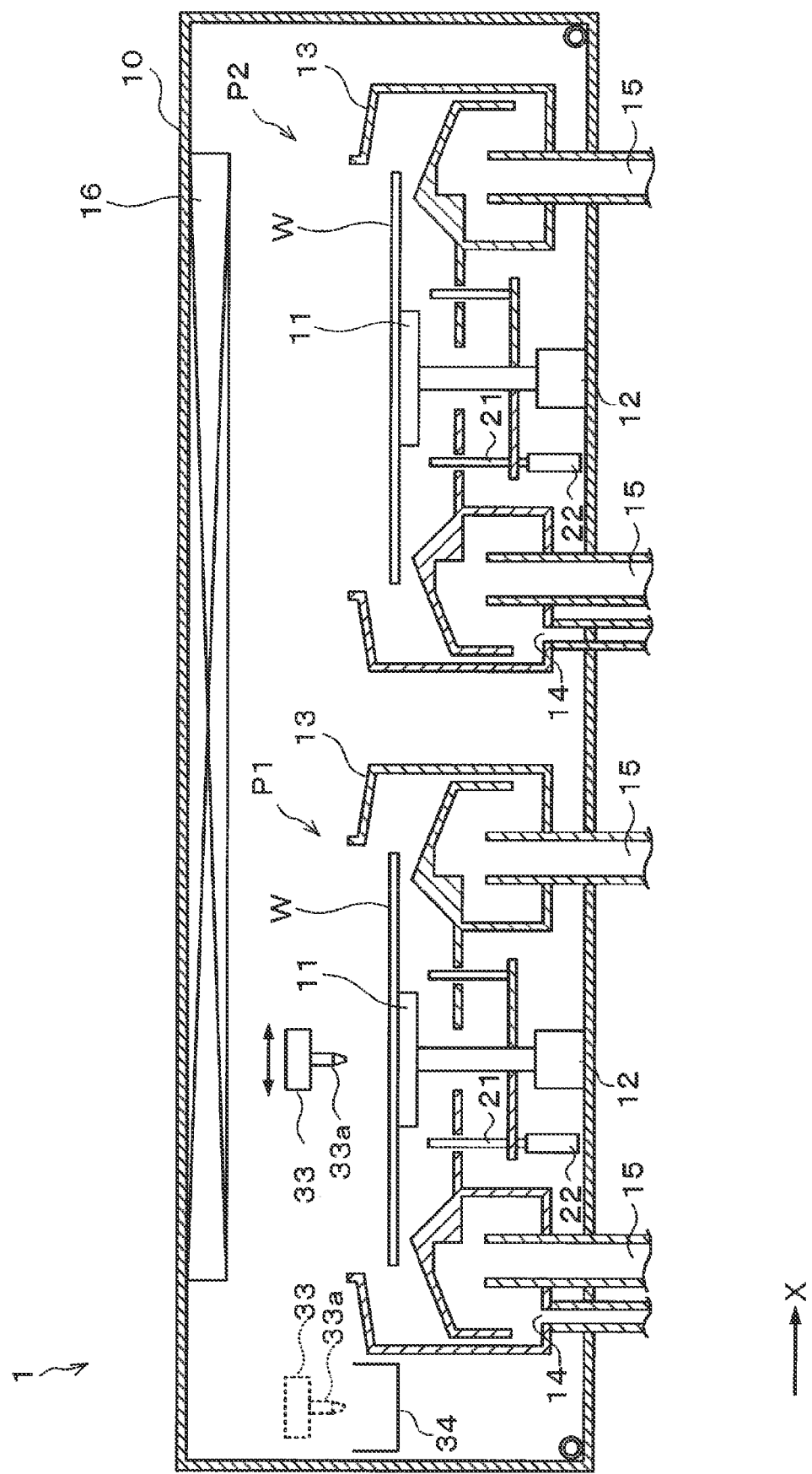
FIG. 1 is a longitudinal sectional view showing a schematic configuration of a resist coating apparatus as a liquid treatment apparatus according to a present embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In a lithography step in a process of manufacturing semiconductor devices or the like, in order to form a desired resist pattern on a semiconductor wafer (hereinafter also referred to as a "wafer"), a resist film forming process of coating a resist liquid on the wafer to form a resist film, or the like, is performed.

A resist coating apparatus that performs the resist film forming process described above is provided with a discharge nozzle that discharges the resist liquid onto the wafer and a liquid supply pipe that supplies the resist liquid to the discharge nozzle. In many cases, a resin tube made of PFA or the like is used for the liquid supply pipe. Further, the resist coating apparatus is provided with a temperature adjustment mechanism for adjusting a temperature of the resist liquid so that the film thickness is uniform in the plane of the wafer and between the wafers. In the film coating apparatus of Patent Document 1, a cooling water for temperature adjustment is used to adjust the temperature of the resist liquid.

If unnecessary water is mixed in the resist liquid, there arises a problem that a resist pattern having a desired shape is not obtained. In the film coating apparatus disclosed in Patent Document 1, the means for suppressing the content of water in the coated film includes the double resin pipe, and the gas including an inert gas exists in the space between the inner pipe and the outer pipe of the double resin pipe so that the double resin pipe is used for the transport system. In Patent Document 1, the liquid transport system transports the coating liquid from the coating liquid container that holds the coating liquid to the coating liquid container in which the substrate is loaded and the film coating is performed on the substrate.

However, in the resist coating apparatus used as the film coating apparatus of Patent Document 1, among the resist lines used as the liquid transport system, a resist line provided with the means for suppressing the content of water is a pipe connecting the resist discharge device having the resist temperature adjusting pipe and the nozzle, and the resist supply container as the coating liquid container. The cooling water for resist liquid temperature adjustment is provided in the resist temperature adjusting pipe in the vicinity of the nozzle. As described above, in the case of performing the temperature adjustment of the resist with water, when a resin such as PFA is used for a pipe that separates the water for temperature adjustment from the resist liquid, the water for temperature adjustment may be mixed in the resist liquid. This holds true in treatment liquids that require temperature adjustment other than the resist liquid used in the manufacture of semiconductor devices and the like.

Therefore, the technique according to the present disclosure prevents water from being mixed in a treatment liquid when adjusting a temperature of a treatment liquid supplied to a discharge nozzle.

Hereinafter, a liquid treatment apparatus and a method of adjusting a temperature of a treatment liquid according to an embodiment will be described with reference to the drawings. In the present specification, elements having substantially the same functional configuration will be denoted by the same reference numerals and therefore, explanation thereof is not repeated.

Figure 2:
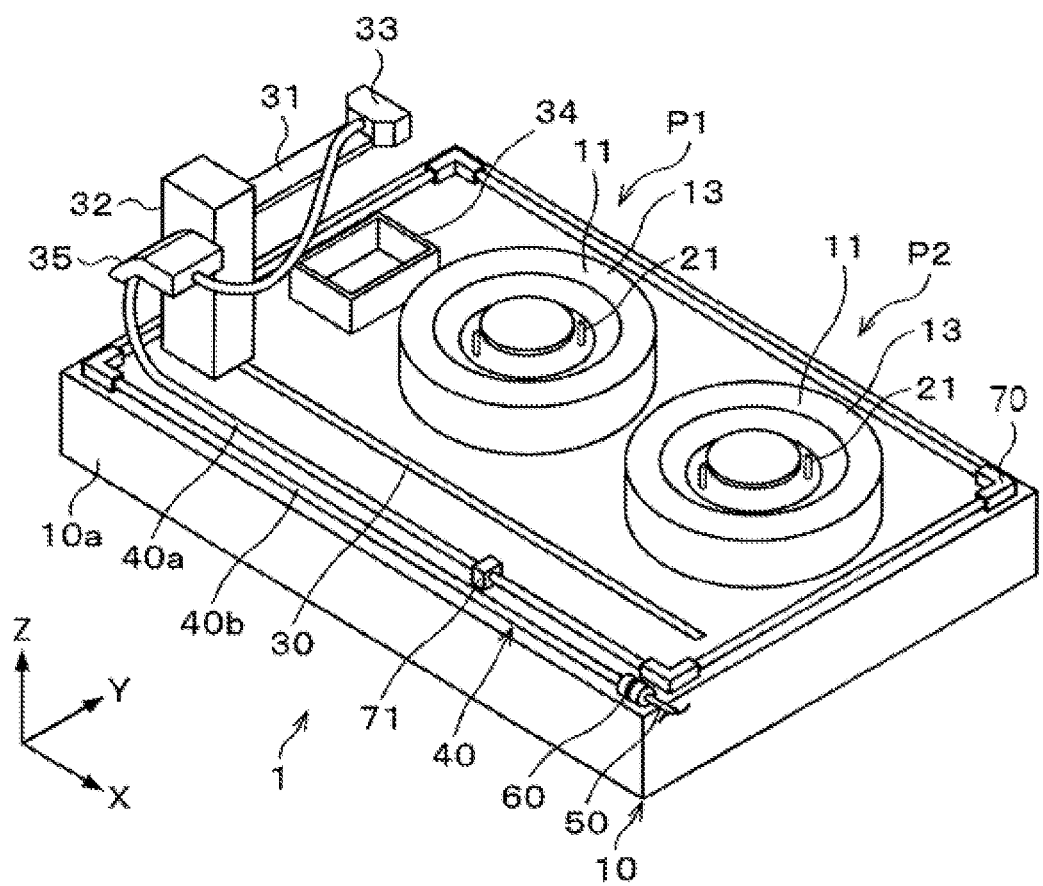
FIG. 2 is a perspective view showing the interior of a processing container of the resist coating apparatus of FIG. 1.
Figure 3:
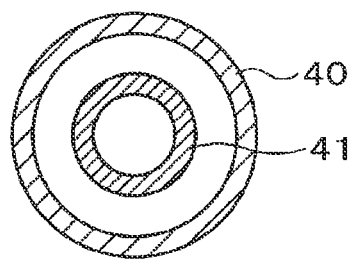
FIG. 3 is a sectional view showing a schematic configuration of a gas pipe.

FIG. 1 is a longitudinal sectional view showing a schematic configuration of a resist coating apparatus as the liquid treatment apparatus according to the embodiment. FIG. 2 is a perspective view showing the interior of a processing container (to be described later) of the resist coating apparatus of FIG. 1. FIG. 3 is a sectional view showing a schematic configuration of a gas pipe (to be described later).

As shown in FIG. 1, the resist coating apparatus 1 has a processing container 10 whose interior can be sealed. A loading/unloading port (not shown) for the wafer W is formed in the side surface of the processing container 10. An opening/closing shutter (not shown) is provided in the loading/unloading port Two processing parts P1 and P2 are provided inside the processing container 10. The processing parts P1 and P2 are arranged so as to be arranged along an apparatus width direction (±X-direction in FIG. 1).

The processing part P1 includes a spin chuck 11 as a substrate holder that holds the wafer W horizontally by vacuum-suctioning the central portion of the back surface of the wafer W. The spin chuck 11 is connected to a rotation mechanism 12 and is rotated about a vertical axis by the rotation mechanism 12. Further, a cup 13 for preventing a treatment liquid from scattering from the wafer W is provided so as to surround the wafer W held by the spin chuck 11. A liquid drain port 14 is opened at the bottom of the cup 13. Further, an exhaust pipe 15 is provided at the bottom of the cup 13. The interior of the cup 13 is exhausted by an exhaust device (not shown) connected to the exhaust pipe 15 during processing of the wafer W.

Elevating pins 21 are arranged around the spin chuck 11. The elevating pins 21 can be elevated vertically by an elevating mechanism 22 to support and elevate the wafer W. By the elevating pins 21, the wafer W can be delivered between the spin chuck 11 and a wafer transfer mechanism (not shown). Since the processing part P2 has the same configuration as the processing part P1, explanation thereof will be omitted.

As shown in FIG. 2, a guide groove 30 extending along the apparatus width direction (±X-direction in FIG. 2) is formed on one side (the side in a negative Y-direction in FIG. 2) of the processing portions P1 and P2 in an apparatus depth direction on a bottom wall 10a of the processing container 10. The guide groove 30 is formed, for example, from the outside of one side (the side in the negative X-direction in FIG. 2) of the cup 13 of the processing part P1 in the apparatus width direction to the outside in the other side (the side in the positive X-direction in FIG. 2) in the apparatus width direction. An arm 31 is attached to the guide groove 30 via a drive mechanism 32 as a moving mechanism.

The arm 31 extends from the drive mechanism 32 in the apparatus depth direction orthogonal to the extension direction of the guide groove 30. A nozzle head 33 is connected to the leading end of the arm 31. As shown in FIG. 1, a discharge nozzle 33a that discharges a resist liquid as a treatment liquid onto the wafer W held by the spin chuck 11 is supported on the lower surface of the nozzle head 33. The resist liquid discharged from the discharge nozzle 33a is, for example, a metal-containing resist used for EUV exposure.

The drive mechanism 32 of FIG. 2 moves in the apparatus width direction (±X-direction in FIG. 2) along the guide groove 30. With the driving of the drive mechanism, the discharge nozzle 33a can move from a standby part 34 provided on the outside of the other side (the side in the positive/negative X-direction in FIG. 2) of the cup 13 of the processing part Pt in the apparatus width direction to above the central portion of the wafer W inside the cup 13. Further, the arm 31 can be raised and lowered by the drive mechanism 32, so that the height of the discharge nozzle 33a can be adjusted.

Further, as shown in FIG. 1, the resist coating apparatus 1 includes a fan filter unit (FFU) 16 as an atmosphere gas supply part for supplying an atmosphere gas into the processing container 10. The fan filter unit 16 is provided to supply clean air whose temperature has been adjusted as the atmosphere gas to the wafer W held by the spin chuck 11. The temperature of the air from the fan filter unit 16 is adjusted to, for example, about 23 degrees C.

Furthermore, in the resist coating apparatus 1, a gas pipe 40 is connected to the nozzle head 33. As shown in FIG. 3, the gas pipe 40 encompasses a liquid supply pipe 41. The liquid supply pipe 41 is configured to supply the resist liquid from a resist liquid storage source (not shown) to the discharge nozzle 33a of the nozzle head 33. Further, an inert gas from a storage source (not shown) of the inert gas such as a $N_2$ gas flows through in a space between the inner wall surface of the gas pipe 40 and the liquid supply pipe 41. The temperature of the inert gas flowing through the gas pipe 40 is adjusted by exchanging heat with the air from the fan filter unit 16 during the flow. Then, the temperature of the resist liquid is adjusted by the temperature-adjusted inert gas. That is, the inert gas flowing through the gas pipe 40 is for adjusting the temperature of the resist liquid. For example, a PFA tube or a high barrier tube obtained by subjecting the surface of a resin tube made of PFA or the like to hydrophobic treatment may be used as the gas pipe 40. Further, a tube made of a metallic material having high thermal conductivity such as SUS may be used for a portion of the gas pipe 40 that does not deform when the discharge nozzle 33*a* is moved by the drive mechanism 32. As for the liquid supply pipe 41, the same tube as the gas pipe 40 may be used.

It should be noted that the gas pipe 40 does not encompass the liquid supply pipe 41 in all the regions thereof, but encompasses the liquid supply pipe 41 only in a portion on the downstream side thereof. In this example, it is assumed that the gas pipe 40 encompasses the liquid supply pipe 41 only in a portion on the downstream side from the vicinity of a fixture 71 to be described later. An encompassing portion 40*a* of the liquid supply pipe 41 in the gas pipe 40 is connected to the nozzle head 33 via a regulating member 35. The regulating member 35 is for regulating the movement of the gas pipe 40 with respect to the nozzle head 33 and the like. In order to maintain the sealability of the gas pipe 40, a sealing member (not shown) is provided around the liquid supply pipe 41 at an insertion portion of the liquid supply pipe 41 in the gas pipe 40.

Further, in the gas pipe 40, an extension portion 40*b*, which is a portion between the upstream end of the gas pipe 40 inside the processing container 10 and the encompassing portion 40*a* of the liquid supply pipe 41, is provided to be folded back in the processing container 10 in a plan view. In the present embodiment, inside the processing container 10, the upstream end of the gas pipe 40 is connected to a joint 60 with respect to an introduction pipe 50 for introducing the inert gas from the inert gas storage source into the processing container 10. Therefore, in the present embodiment, the extension portion 40*b* is from a portion connected to the joint 60 of the gas pipe 40 to the encompassing portion 40*a*.

Inside the processing container 10, the gas pipe 40 is arranged so that the above-mentioned extension portion 40*b* is folded back in a plan view. Specifically, in the gas pipe 40, the extension portion 40*b* is arranged so as to be folded back in the movement direction of the discharge nozzle 33*a* by the drive mechanism 32 in a plan view, that is, the apparatus width direction (±X-direction in FIG. 2), and is arranged so as to be folded back in a direction orthogonal to the apparatus width direction in a plan view, that is, in the apparatus depth direction (±Y-direction in FIG. 2). More specifically, the extension portion 40*b* is arranged to travel on the bottom wall 10*a* so as to extend around the interior of the processing container 10 along the side wall of the processing container 10. Therefore, the extension portion 40*b* has bent portions in the vicinity of four corners in the processing container 10.

Further, the processing container 10 has an L-shaped fixture 70 in a plan view and a linear fixture 71 in a plan view for fixing the gas pipe 40 inside the processing container 10. The fixture 70 fixes the bent portions in the vicinity of four corners in the processing container 10 in the extension portion 40*b* of the gas pipe 40 to the bottom wall 10*a* of the processing container 10. The fixture 71 fixes a portion of the gas pipe 40, which is further downstream than the bent portion at the most downstream of the extension portion 40*b*, to the bottom wall 10*a* of the processing container 10. As the material of the fixtures 70 and 71, a metallic material such as stainless steel having higher thermal conductivity than the gas pipe 40 may be used. A part having a through-hole, which is called through-joint, may be used as each of the fixtures 70 and 71. However, the through-joints as the fixtures 70 and 71 is not used for the purpose of connecting gas pipes to each other, but is used for the purpose of stabilizing the position of the gas pipe 40 by fixing the through-joints with the gas pipe 40 inserted through the through-holes of the through-joints.

A metallic material having higher thermal conductivity than the gas pipe 40 may be used not only for the fixtures 70 and 71 but also for the material of the joint 60.

Next, an example of wafer processing in the resist coating apparatus 1 will be described.

First, the wafer W is transferred into the processing container 10 and placed and adsorbed on the spin chuck 11 of any of the processing parts P1 and P2. Here, it is assumed that the wafer W is placed and adsorbed on the spin chuck 11 of the processing part P1.

Subsequently, the discharge nozzle 33*a* is moved above the center of the wafer W held by the spin chuck 11 of the processing part P1 with the driving of the drive mechanism 32. Then, the wafer W held by the spin chuck 11 is rotated with the driving of the rotation mechanism 12, and the discharge nozzle 33*a* discharges the temperature-adjusted resist liquid to the rotating wafer W.

In order to adjust the temperature of the resist liquid, in the resist coating apparatus 1, the temperature-adjusted air from the fan filter unit 16 is first used to adjust the temperature of the inert gas, which passes through the extension portion 40*b* of the gas pipe 40, to, for example, about 23 degrees C. Then, in the encompassing portion 40*a* on the downstream side of the extension portion 40*b*, the temperature of the resist liquid flowing through the liquid supply pipe 41 is adjusted to, for example, about 23 degrees C. by the temperature-adjusted inert gas.

After the resist liquid is discharged to form a resist film on the wafer W, the discharge nozzle 33*a* is retracted to the standby part 34, and the wafer W is discharged from the processing container 10. In this way, the wafer processing is completed.

As described above, in the present embodiment, the resist coating apparatus 1 has the spin chuck 11 that holds the wafer W, and the discharge nozzle 33*a* that discharges the resist liquid to the wafer W held by the spin chuck 11. Further, the resist coating apparatus 1 has the liquid supply pipe 41 that supplies the resist liquid from the resist liquid storage source to the discharge nozzle 33*a*, and the gas pipe 40 that encompasses the liquid supply pipe 41 and through which the inert gas for adjusting the temperature of the resist liquid flows in the space between the gas pipe 40 and the liquid supply pipe 41. Further, the resist coating apparatus 1 has the processing container 10 in which the spin chuck 11, the discharge nozzle 33*a* the liquid supply pipe 41, and the gas pipe 40 are provided, and the fan filter unit 16 that supplies the atmosphere gas into the processing container 10. Furthermore, in the resist coating apparatus 1, the gas pipe 40 has the extension portion 40*b* which is a portion between the upstream end in the processing container 10 and the encompassing portion 40*a* encompassing the liquid supply pipe 41. Therefore, the inert gas that has exchanged heat with the atmosphere gas from the fan filter unit 16 in the extension portion 40*b* can be supplied to the encompassing portion 40*a* encompassing in the liquid supply pipe 41. Further, in the present embodiment, since the extension portion 40*b* of the gas pipe 40 is arranged so as to be folded back inside the processing container 10 in a plan view to lengthen the extension portion 40*b*, the heat exchange can be promoted in the extension portion 40*b*. Therefore, it is possible to more reliably make the temperature of the resist liquid substantially equal to the temperature of the atmosphere gas from the fan filter unit 16. That is, the temperature of the resist liquid can be adjusted more reliably. Further, in the present embodiment, since the inert gas is used to adjust the temperature of the resist liquid in the vicinity of the discharge nozzle 33a instead of the temperature regulating water, unnecessary moisture is not mixed in the resist liquid. In a case in which a metal-containing resist liquid is used as the resist liquid, when unnecessary moisture is mixed in the resist liquid, the line width of the resist pattern may fluctuate. However, according to the present embodiment, the fluctuation as described above can be prevented.

Unlike the technique according to the present embodiment, a method of adjusting the temperature of the resist liquid by using an inert gas whose temperature is adjusted outside the resist coating apparatus 1 may be considered. However, in the case of this method, it is necessary to dispose a temperature adjusting mechanism of the inert gas separately from the resist coating apparatus 1, and the position of the temperature adjusting mechanism needs to be in the vicinity of the resist coating apparatus 1 so as not to prevent the temperature of the inert gas from being affected by the outside until it reaches the resist coating apparatus 1. Therefore, the above-mentioned method different from the technique according to the present embodiment has a problem in an installation space of the resist coating apparatus including the inert gas temperature adjusting mechanism. In contrast, in the present embodiment, since the inert gas temperature adjusting mechanism does not need to be arranged separately from the resist coating apparatus 1, the space related to the resist coating apparatus 1 can be reduced. Thus, the above-mentioned problem in the installation space does not occur.

Further, in the present embodiment, a metallic material having higher thermal conductivity than the gas pipe 40 is used as the material of the fixtures 71 and 72 for fixing the gas pipe 40 inside the processing container 10. Accordingly, the fixtures 71 and 72 are easily heated and cooled down by the atmosphere gas from the fan filter unit 16. Therefore, the heat exchange between the atmosphere gas from the fan filter unit 16 and the inert gas flowing through the gas pipe 40 can be further promoted at the arrangement positions of the fixtures 71 and 72.

Further, in the present embodiment, a metallic material having higher thermal conductivity than the gas pipe 40 is used as the material of the joint 60. Accordingly, the joint 60 is easily heated and cooled down by the atmosphere gas from the fan filter unit 16. Therefore, the heat exchange between the atmosphere gas from the fan filter unit 16 and the inert gas flowing through the gas pipe 40 can be further promoted at the arrangement position of the joint 60. When the gas pipe 40 is divided into a plurality of sections which are connected to each other by respective joints, a metallic material having higher thermal conductivity than the gas pipe 40 may also be used as materials of the joints.

Figure 4:
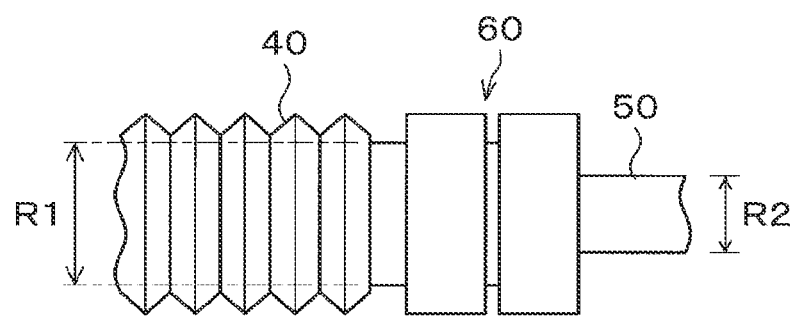
FIG. 4 is an enlarged plan view showing a specific example of the gas pipe.

FIG. 4 is an enlarged plan view showing a specific example of the gas pipe 40.

As shown in FIG. 4, the outer circumference of the gas pipe 40 may be formed in a bellows shape. The surface area of the outer circumferential surface of the gas pipe 40 can be increased by forming the outer circumference of the gas pipe 40 in the bellows shape. As a result, the heat exchange between the atmosphere gas from the fan filter unit 16 and the inert gas flowing through the gas pipe 40 can be further promoted.

Further, an outer diameter R1 of the gas pipe 40 may be larger than an outer diameter R2 of the introduction pipe 50 that introduces the inert gas from the inert gas storage source into the processing container 10. This makes it is possible to increase the surface area of the outer wall surface of the gas pipe 40. As a result, the heat exchange between the atmosphere gas from the fan filter unit 16 and the inert gas flowing through the gas pipe 40 can be further promoted. In some embodiments, an inner diameter of the gas pipe 40 may be larger than an inner diameter of the introduction pipe 50. As a result, since a flow velocity of the inert gas inside the gas pipe 40 can be reduced, the heat exchange can be further promoted.

In the above example, a single liquid supply pipe 41 is encompassed in the gas pipe 40. However, a plurality of liquid supply pipes 41 may be encompassed in the gas pipe 40.

Figure 5:
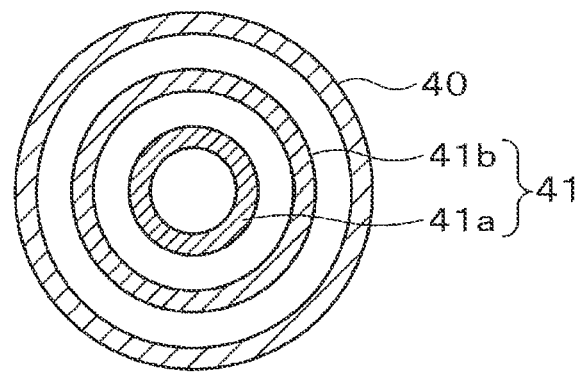
FIG. 5 is a sectional view for explaining another example of a liquid supply pipe.

FIG. 5 is a sectional view for explaining another example of the liquid supply pipe 41.

As shown in FIG. 5, the liquid supply pipe 41 may have a double pipe structure composed of an inner pipe 41a and an outer pipe 41b. A metal-containing resist liquid as a resist liquid may be flowed into the inner pipe 41a and an acid solvent may be flowed between the inner pipe 41a and the outer pipe 41b. When moisture is mixed in the metal-containing resist liquid that is originally adjusted to be acidic so that the metal-containing resist liquid becomes neutral, among a hydrolysis reaction and a polycondensation reaction, the percentage of the poly condensation reaction becomes large. As a result, the number of particles and the line width may become large. In contrast, as in this example, by flowing the acid solvent to the outside of the inner tube 41a through which the resist liquid flows, even if moisture is mixed in the resist liquid, the acid solvent is intentionally mixed in the resist liquid. Thus, the resist liquid can be kept acidic. Accordingly, the increase in the number of particles and the increase in the line width can be prevented. As the acid solvent, for example, a mixture of a carboxylic acid such as formic acid or acetic acid with an organic solvent may be used.

Further, it is preferable that the liquid supply pipe 41 is thicker than the conventional one. By making the liquid supply pipe 41 thicker, the amount of moisture that flows through the liquid supply pipe 41 and is mixed in the resist liquid discharged from the discharge nozzle 33a can be further suppressed. Further, it is preferable that an internal pressure of the liquid supply pipe 41 through which the resist liquid flows is higher than that of the conventional one. By making the internal pressure of the liquid supply pipe 41 higher, the amount of moisture that flows through the liquid supply pipe 41 and is mixed in the resist liquid discharged from the discharge nozzle 33a can be further suppressed.

In the above example, the gas pipe 40 is arranged so that the extension portion 40b extends around the interior of the processing container 10. That is, the gas pipe 40 is arranged such that the extension portion 40b is folded back in the apparatus width direction and is also folded back in the apparatus depth direction. Without being limited to this example, the gas pipe 40 may be arranged such that the extension portion 40b may be folded back only in the apparatus width direction, or the extension portion 40b may be folded back only in the apparatus depth direction. Further, in the above examples, the resist liquid is used as the treatment liquid to be supplied to the discharge nozzle, but the treatment liquid is not limited thereto. For example, the treatment liquid may be a coating liquid for forming a coating film by spin coating or the like, other than the resist liquid. More specifically the treatment liquid may be a coating liquid containing both organic and inorganic substances (for example, a coating liquid used for forming a SiARC film or a Spin On metal film) other than the metal-containing resist.

It should be noted that the embodiments disclosed herein are exemplary in all respects and are not restrictive. The above-described embodiments may be omitted, replaced or modified in various forms without departing from the scope and spirit of the appended claims.

The following configurations also belong to the technic-al scope of the present disclosure.

(1) A liquid treatment apparatus includes: a substrate holder configured to hold a substrate; a discharge nozzle configured to discharge a treatment liquid onto the substrate held by the substrate holder; a liquid supply pipe configured to supply the treatment liquid from a treatment liquid storage source to the discharge nozzle; a gas pipe that encompasses the liquid supply pipe and through which an inert gas for adjusting the temperature of the treatment liquid flows in a space between the gas pipe and the liquid supply pipe; a processing container in which the substrate holder, the discharge nozzle, the liquid supply pipe, and the gas pipe are provided; and an atmosphere gas supply part configured to supply an atmosphere gas into the processing container, wherein an extension portion of the gas pipe is folded back inside the processing container in a plan view, the extension portion being a portion between an upstream end inside the processing container and an encompassing portion that encompasses the liquid supply pipe.

According to (1) above, it is possible to prevent moisture from being mixed into the treatment liquid when the temperature of the treatment liquid to be supplied to the discharge nozzle is adjusted. Further, the atmosphere gas from the temperature-adjusted atmosphere gas supply part is used to adjust the temperature of the inert gas used for adjusting the temperature of the treatment liquid. By providing the gas pipe as in (1) above, the heat exchange between the inert gas and the atmosphere gas can be further promoted.

(2) The liquid treatment apparatus of (1) above further includes a moving mechanism configured to move the discharge nozzle in a predetermined direction in the plan view.

(3) In the liquid treatment apparatus of (2) above, the extension portion of the gas pipe is folded back in a movement direction of the discharge nozzle by the moving mechanism.

(4) In the liquid treatment apparatus of (2) or (3) above, the extension portion of the gas pipe is folded back in a direction orthogonal to the movement direction of the discharge nozzle by the moving mechanism.

(5) In the liquid treatment apparatus of any one of (2) to (4) above, the extension portion of the gas pipe extends around an interior of the processing container.

(6) The liquid treatment apparatus of any one of (1) to (5) above further includes a fixture configured to fix the gas pipe inside the processing container, wherein the fixture is made of a metallic material having higher thermal conductivity than that of the gas pipe.

According to (6) above, the heat exchange between the inert gas and the atmosphere gas can be further promoted.

(7) In the liquid treatment apparatus of any one of (1) to (6) above, an outer circumference of the gas pipe is formed in a bellows shape.

According to (7) above, the heat exchange between the inert gas and the atmosphere gas can be further promoted.

(8) In the liquid treatment apparatus of any one of (1) to (7) above, the processing container has a Joint that connects an introduction pipe and the gas pipe, the introduction pipe being configured to introduce the inert gas from an inert gas storage source into the processing container, and the joint is made of a metallic material having higher thermal conductivity than that of the gas pipe.

According to (8) above, the heat exchange between the inert gas and the atmosphere gas can be further promoted.

(9) In the liquid treatment apparatus of any one of (1) to (8) above, the gas pipe has an outer diameter larger than that of the introduction pipe configured to introduce the inert gas from the inert gas storage source into the processing container.

According to (9) above the heat exchange between the inert gas and the atmosphere gas can be further promoted.

(10) There is provided a method of adjusting a temperature of a treatment liquid in a liquid treatment apparatus. The liquid treatment apparatus includes: a substrate holder configured to hold a substrate; a discharge nozzle configured to discharge the treatment liquid onto the substrate held by the substrate holder; a liquid supply pipe configured to supply the treatment liquid from a treatment liquid storage source to the discharge nozzle; a gas pipe that encompasses the liquid supply pipe and through which an inert gas for adjusting the temperature of the treatment liquid flows in a space between the gas pipe and the liquid supply pipe; a processing container in which the substrate holder, the discharge nozzle, the liquid supply pipe, and the gas pipe are provided; and an atmosphere gas supply part configured to supply an atmosphere gas into the processing container, wherein an extension portion of the gas pipe is folded back inside the processing container in a plan view, the extension portion being a portion between an upstream end inside the processing container and an encompassing portion that encompasses the liquid supply pipe. The method includes: adjusting a temperature of the inert gas flowing through the gas pipe with the atmosphere gas from the atmosphere gas supply part; and adjusting the temperature of the treatment liquid flowing through the liquid supply pipe with the inert gas having the adjusted temperature.

According to the present disclosure in some embodiments, when a temperature of a treatment liquid to be supplied to a discharge nozzle is adjusted, it is possible to prevent unnecessary moisture from being mixed into the treatment liquid.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A liquid treatment apparatus comprising:
a substrate holder configured to hold a substrate;
a discharge nozzle configured to discharge a treatment liquid onto the substrate held by the substrate holder;
a liquid supply pipe configured to supply the treatment liquid from a treatment liquid storage source to the discharge nozzle;
a gas pipe;
a processing container in which the substrate holder, the discharge nozzle, the liquid supply pipe, and the gas pipe are provided;
an atmosphere gas supply part configured to supply an atmosphere gas into the processing container; and an introduction pipe configured to introduce an inert gas from an inert gas storage source into the processing container, wherein the gas pipe includes:
- an encompassing portion that encompasses the liquid supply pipe and through which the inert gas flows in a space between the gas pipe and the liquid supply pipe; and
- an extension portion that does not encompass the liquid supply pipe and is disposed between an upstream end of the gas pipe inside the processing container and the encompassing portion, and through which the inert gas flows, and wherein the extension portion of the gas pipe is folded back inside the processing container in a plan view.

2. The liquid treatment apparatus of claim 1, wherein the inert gas adjusts the temperature of the treatment liquid flowing through the liquid supply pipe.

3. The liquid treatment apparatus of claim 2, further comprising: a moving mechanism configured to move the discharge nozzle in a predetermined direction in the plan view.

4. The liquid treatment apparatus of claim 3, wherein the extension portion of the gas pipe is folded back in a movement direction of the discharge nozzle by the moving mechanism.

5. The liquid treatment apparatus of claim 4, wherein the extension portion of the gas pipe is further folded back in a direction orthogonal to the movement direction of the discharge nozzle by the moving mechanism.

6. The liquid treatment apparatus of claim 5, wherein the extension portion of the gas pipe extends around an interior of the processing container.

7. The liquid treatment apparatus of claim 6, further comprising: a fixture configured to fix the gas pipe inside the processing container,
wherein the fixture is made of a metallic material having higher thermal conductivity than that of the gas pipe.

8. The liquid treatment apparatus of claim 7, wherein an outer circumference of the gas pipe is formed in a bellows shape.

9. The liquid treatment apparatus of claim 8, wherein the gas pipe has an outer diameter larger than that of the introduction pipe.

10. The liquid treatment apparatus of claim 1, further comprising: a fixture configured to fix the gas pipe inside the processing container,
wherein the fixture is made of a metallic material having higher thermal conductivity than that of the gas pipe.

11. The liquid treatment apparatus of claim 1, wherein an outer circumference of the gas pipe is formed in a bellows shape.

12. The liquid treatment apparatus of claim 1, wherein the gas pipe has an outer diameter larger than that of the introduction pipe.

13. A method of adjusting a temperature of a treatment liquid in a liquid treatment apparatus, wherein the liquid treatment apparatus includes:
- a substrate holder configured to hold a substrate;
- a discharge nozzle configured to discharge the treatment liquid onto the substrate held by the substrate holder;
- a liquid supply pipe configured to supply the treatment liquid from a treatment liquid storage source to the discharge nozzle;
- a gas pipe;
- a processing container in which the substrate holder, the discharge nozzle, the liquid supply pipe, and the gas pipe are provided;
- an atmosphere gas supply part configured to supply an atmosphere gas into the processing container; and
- an introduction pipe configured to introduce an inert gas from an inert gas storage source into the processing container, wherein the gas pipe includes:
- an encompassing portion that encompasses the liquid supply pipe and through which the inert gas flows in a space between the gas pipe and the liquid supply pipe; and
- an extension portion that does not encompass the liquid supply pipe and is disposed between an upstream end of the gas pipe inside the processing container and the encompassing portion, and through which the inert gas flows, and wherein the extension portion of the gas pipe is folded back inside the processing container in a plan view, the method comprising:
- adjusting a temperature of the inert gas flowing through the gas pipe with the atmosphere gas from the atmosphere gas supply part; and
- adjusting the temperature of the treatment liquid flowing through the liquid supply pipe with the inert gas having the adjusted temperature.

14. The method of claim 13, wherein the inert gas adjusts the temperature of the treatment liquid flowing through the liquid supply pipe.

* * * * *